(12) United States Patent
Webster

(10) Patent No.: US 6,441,503 B1
(45) Date of Patent: Aug. 27, 2002

(54) BOND WIRE PRESSURE SENSOR DIE PACKAGE

(75) Inventor: Steven Webster, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/754,393

(22) Filed: Jan. 3, 2001

(51) Int. Cl.$^7$ ................................................ H01L 23/28
(52) U.S. Cl. ........................................ 257/787; 237/417
(58) Field of Search .............................. 257/787, 417, 257/419, 687

(56) References Cited

U.S. PATENT DOCUMENTS

| | | | |
|---|---|---|---|
| 3,748,571 A | 7/1973 | Kurtz .......................... 323/74 |
| 4,874,500 A | * 10/1989 | Madou et al. | |
| 5,037,779 A | 8/1991 | Whalley et al. ............. 437/211 |
| 5,096,851 A | 3/1992 | Yamazaki et al. .......... 437/205 |
| 5,148,266 A | 9/1992 | Khandros et al. ............ 357/80 |
| 5,173,836 A | 12/1992 | Tomase et al. ............. 361/283 |
| 5,177,661 A | 1/1993 | Zavracky et al. ........... 361/283 |
| 5,296,730 A | 3/1994 | Takano ........................ 257/417 |
| 5,438,877 A | 8/1995 | Vowles et al. ................. 73/756 |
| 5,635,671 A | 6/1997 | Freyman et al. ............ 174/52.2 |
| 5,719,069 A | 2/1998 | Sparks .......................... 437/59 |
| 5,721,446 A | 2/1998 | Kobayashi ................... 257/419 |
| 5,852,320 A | 12/1998 | Ichihashi .................... 257/419 |
| 5,981,361 A | 11/1999 | Yamada ...................... 438/464 |
| 6,140,144 A | * 10/2000 | Najafi et al. | |
| 6,150,681 A | 11/2000 | Allen .......................... 257/254 |
| 6,155,119 A | * 12/2000 | Normann et al. | |
| 6,201,285 B1 | 3/2001 | Iwata et al. .................. 257/419 |
| 6,229,190 B1 | 5/2001 | Bryzek et al. .............. 257/419 |
| 6,254,815 B1 | 7/2001 | Cheperak .................... 264/135 |
| 6,255,728 B1 | 7/2001 | Nasiri et al. ................ 257/704 |
| 6,278,167 B1 | 8/2001 | Bever et al. ................ 257/415 |
| 6,326,682 B1 | 12/2001 | Kurtz .......................... 257/678 |
| 6,338,985 B1 | 1/2002 | Greenwood ................. 438/126 |
| 6,346,742 B1 | 2/2002 | Bryzek et al. .............. 257/704 |

* cited by examiner

Primary Examiner—Sheila V. Clark
(74) Attorney, Agent, or Firm—Gunnison, McKay & Hodgson, L.L.P.; Philip J. McKay

(57) ABSTRACT

A plurality of pressure sensor dice are attached to an array of pressure sensor die attach sites located on a substrate. The pressure sensor dice are then electrically connected to the pressure sensor die attach sites using standard wire bond techniques.

The resulting array of pressure sensor sub-assemblies is then molded, using a mold tool that closes on three sides of the substrate so that a cavity is formed that is open on the fourth side. A portion of the outer surface of the micro-machine element of each pressure sensor die is left exposed at the bottom of a cavity or hole in the encapsulant. After molding, the exposed outer surface of the micro-machine element is covered with a pressure coupling gel applied in the cavity. The resulting array of packaged pressure sensors are then sigulated using well know sawing or laser techniques or by snapping a specially formed snap array.

28 Claims, 16 Drawing Sheets

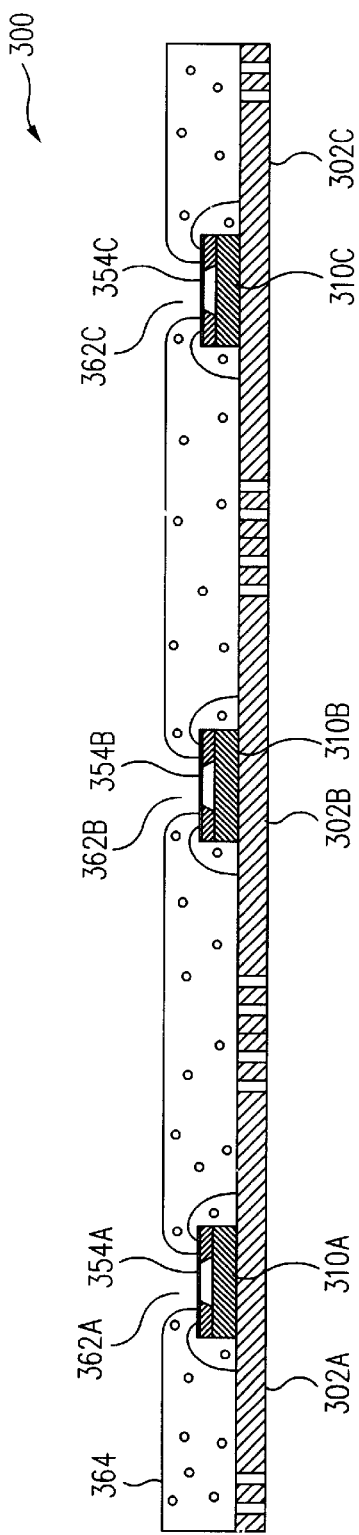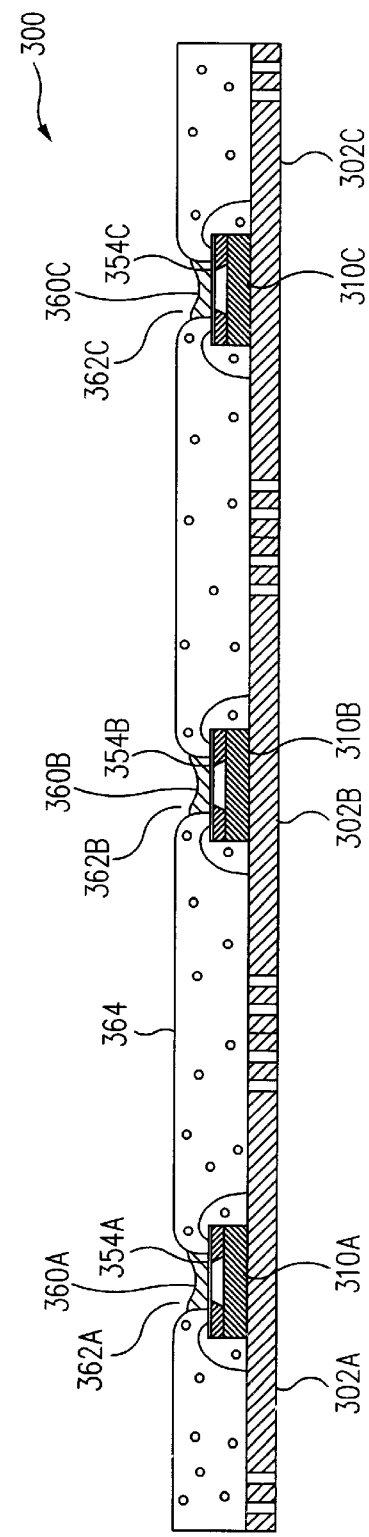

BOND WIRE PRESSURE SENSOR DIE PACKAGE

This Application is related to: co-filed U.S. patent application Ser. No. 09/754,229, entitled "METHOD FOR FORMING A BOND WIRE PRESSURE SENSOR PACKAGE", and naming Steven Webster as inventor; co-filed U.S. patent application Ser. No. 09/754,487, entitled "FLIP CHIP PRESSURE SENSOR PACKAGE", and naming Steven Webster as inventor; and co-filed U.S. patent application Ser. No. 09/754,239, entitled "METHOD FOR FORMING A FLIP CHIP PRESSURE SENSOR PACKAGE", and naming Steven Webster as inventor; all of which are assigned to the assignee of the present invention and are incorporated herein, in their entirety, by reference for all purposes.

FIELD OF THE INVENTION

The present invention relates generally to the packaging of electronic components. More particularly, the present invention relates to methods for making bond wire pressure sensor die packages.

BACKGROUND OF THE INVENTION

FIG. 1A illustrates a pressure sensor die 10 suitable for use with the present invention. In one embodiment, pressure sensor die 10 is a piezoresistive pressure sensor. Piezoresistive pressure sensors are discussed, and one method for making piezoresistive pressure sensors is disclosed, in U.S. Pat. No. 5,719,069, entitled "ONE-CHIP INTEGRATED SENSOR PROCESS", issued Feb. 17, 1998 to Sparks, which is incorporated, in its entirety, by reference herein. Another type of pressure sensor is disclosed in U.S. Pat. No. 3,748,571, entitled "PRESSURE SENSITIVE TRANSDUCERS EMPLOYING CAPACITIVE AND RESISTIVE VARIATIONS", issued Jul. 24, 1973 to Kurtz, which is also incorporated, in its entirety, by reference herein.

Pressure sensors and pressure sensor die assemblies are well known to those of skill in the art and come in a large variety of sizes and configurations. Consequently, while one embodiment of a pressure sensor die 10 is discussed below, it will be recognized by those of skill in the art that numerous other types of pressure sensors will work equally well with the present invention.

Referring back to FIG. 1A, pressure sensor die 10 includes a pressure sensitive micro-machine element 54 which is a pressure sensing membrane composed of a portion of the epitaxial silicon layer 16. Pressure sensor die 10 also includes a plurality of piezoresistors 14 formed in epitaxial silicon layer 16. Piezoresistors 14 serve as sensing elements for micro-machine element 54.

Pressure sensor die 10 is formed by bonding a substrate 18 to a glass or silicon wafer 20. Substrate 18 includes a cavity 22 such that when substrate 18 is bonded to wafer 20, wafer 20 seals cavity 22. Cavity 22 is positioned directly below micro-machine element 54. In one embodiment, wafer 20 hermetically seals cavity 22 so that pressure sensor die 10 is an absolute pressure sensor.

FIG. 1B shows another embodiment of a pressure sensor die 10B, which includes a die hole 60 through wafer 20 to vent cavity 22 making pressure sensor die 10B a differential pressure sensor. As discussed in more detail below, the method and structure of the present invention works equally well with both absolute pressure sensors, such as pressure sensor die 10, and differential pressure sensors, such as pressure sensor die 10B.

Pressure sensor die 10 or 10B is typically used to monitor the pressure of an external fluid, i.e., a gas or liquid, by placing first or outer surface 56 of pressure sensor die 10 or pressure sensor die 10B, including micro-machine element 54, in contact with the external fluid. During normal operation of pressure sensor die 10 or 10B, micro-machine element 54 flexes in response to pressure on first or outer surface 56. This flex is sensed by piezoresistors 14 and processed to determine the pressure exerted on first or outer surface 56 by the external fluid, i.e., the pressure of the liquid or gas.

The structure and operation of pressure sensors, such as pressure sensor die 10 and pressure sensor die 10B, is well known to those of skill in the art. Consequently, a more detailed discussion of the structure and operation of pressure sensor die 10 and pressure sensor die 10B is omitted here to avoid detracting from the present invention. However, it is worth noting here that, as discussed above, in order for pressure sensor die 10 or pressure sensor die 10B to function, first or outer surface 56, including micro-machine element 54 must be flexibly coupled to the surrounding environment and cannot be shielded from that environment by interposing layers of packaging material such as plastics or epoxies.

FIG. 1C is an enlarged cross-sectional view of a pressure sensor sub-assembly 100 including a pressure sensor die 110 mounted on a substrate 102 in die attach region 131. Like pressure sensor die 10 of FIG. 1A, pressure sensor die 110 (FIG. 1C) includes a pressure sensitive micro-machine element 154 composed of a portion of the epitaxial silicon layer 116. Like pressure sensor die 10 discussed above, pressure sensor die 110 is formed by bonding a substrate 118 to a glass or silicon wafer 120. Substrate 118 includes a cavity 122 such that when substrate 118 is bonded to wafer 120, wafer 120 seals cavity 122. Cavity 122 is positioned directly below micro-machine element 154.

Pressure sensor die 110 is attached to a first surface 111 (a die attach surface) of substrate 102 in die attach region 131 using any one of several well-known adhesives 104. Substrate 102 is typically a printed circuit board (PCB). In one embodiment, electrically conductive contacts or pads 106 on first or outer surface 130 of pressure sensor die 110 are connected with electrically conductive bond wires 103 to electrically conductive traces 112 and/or electrically conductive regions (not shown) formed on first surface 111 of substrate 102. Electrically conductive vias 114 are formed through substrate 102, from traces 112 and/or regions on first surface 111 to a second surface (the mounting surface) 140 of substrate 102 which is opposite first surface 111. Electrically conductive traces 113 formed on second surface 140 of substrate 102 extend to electrically conductive contact or pads 115 formed on second surface 140 of substrate 102. Electrically conductive contacts 115 are used to connect substrate 102 and pressure sensor die 110 to a larger system, such as a mother board (not shown), using well known methods such as solder balls, pins, leadless carrier chip (LCC) contacts or other surface mounts.

SUMMARY OF THE INVENTION

In accordance with the present invention, a plurality of pressure sensor die packages are fabricated simultaneously, in an array, to minimize the cost associated with each individual pressure sensor die package.

In one embodiment of the invention, a plurality of pressure sensor dice are attached to an array of pressure sensor die sites located on a substrate. The pressure sensor dice are then electrically connected to the pressure sensor die sites using, in one embodiment, standard wire bond techniques.

The resulting array of pressure sensor die sub-assemblies is then molded, in one embodiment of the invention, using a mold tool that closes on three sides of the substrate so that a cavity is formed that is open on the fourth side. To this end, a first portion of the molding tool has a plurality of insert pins that close on the outer surface of each pressure sensor die.

As a result, using the method of the invention, a portion of the outer surface of the micro-machine element of each pressure sensor die is left exposed at the bottom of a cavity in the molding encapsulant. After molding, the exposed outer surface of the micro-machine element is covered with a pressure coupling gel that is applied in the shallow cavity. The coupling gel protects micro-machine elements from the environment, yet is compressible and is capable of coupling pressure from the external environment to the micro-machine elements.

The resulting array of packaged pressure sensor dice are then sigulated using well known sawing or laser techniques or by snapping a specially formed snap array.

In another embodiment of the invention, a hole is formed in the array substrate and the pressure sensor substrate to accommodate a differential pressure sensor die.

In another embodiment of the invention, a custom substrate is formed with a plurality of holes formed, one each, at pressure sensor die mounting sites. A plurality of pressure sensor dice are then attached to pressure sensor die mounting sites located on the substrate. The pressure sensor dice are then electrically connected to the pressure sensor sites using, in this embodiment, standard flip-chip techniques.

The resulting array of pressure sensor die sub-assemblies is then molded, using a mold tool that closes on the substrate and is filled with encapsulant.

Using this embodiment of the method of the invention, a portion of the outer surface of the micro-machine element of each pressure sensor die is left exposed at the bottom of the holes in the substrate. After molding, the exposed outer surface of the micro-machine element is covered with a,pressure coupling gel applied in the hole in the substrate. The resulting array of packaged pressure sensors are then sigulated using well known sawing or laser techniques or by snapping a specially formed snap array.

In another embodiment of the invention, a cavity is formed in the encapsulant and the pressure sensor substrate to accommodate a differential pressure sensor die.

In particular, one embodiment of the invention includes: a pressure sensor die, the pressure sensor die having a pressure sensor die first surface and a pressure sensor die second surface, opposite the pressure sensor die first surface; a substrate, the substrate having a substrate first surface and a substrate second surface, opposite the substrate first surface, the substrate first surface having a die attach region, the pressure sensor die second surface being attached to the substrate first surface in the die attach region; and encapsulant, the encapsulant having an outer surface, the encapsulant covering a portion of the substrate first surface and the pressure sensor die, the encapsulant including a cavity over the pressure sensor die first surface such that a first region of the pressure sensor die first surface is not covered by the encapsulant.

In one embodiment of the invention, the pressure sensor die package also includes a coupling gel, the coupling gel filling at least a portion of the cavity in the encapsulant such that the coupling gel covers the first region of the pressure sensor die first surface.

These and other features and advantages of the present invention will be more readily apparent from the detailed description set forth below taken in conjunction with the accompanying drawings.

BRIEF DESCRIPTION OF THE DRAWINGS

FIG. 3I shows the multi-package array sub-assembly removed from the lower mold section after molding according to the principles of the invention;

FIG. 3J shows the multi-package array sub-assembly of FIG. 3I with a coupling gel applied to, and filling, a portion of the cavities formed according to the principles of the invention;

In the following description, similar elements are labeled with similar reference numbers.

DETAILED DESCRIPTION

In accordance with the present invention, a plurality of pressure sensor die packages (FIGS. 2A, 2B, 3L, 4A, 4B and 5M) are fabricated simultaneously in an array (FIGS. 3K and 5L) to minimize the cost associated with each individual pressure sensor die package (FIGS. 2A, 2B, 3L, 4A, 4B and 5M).

Figure 3A:
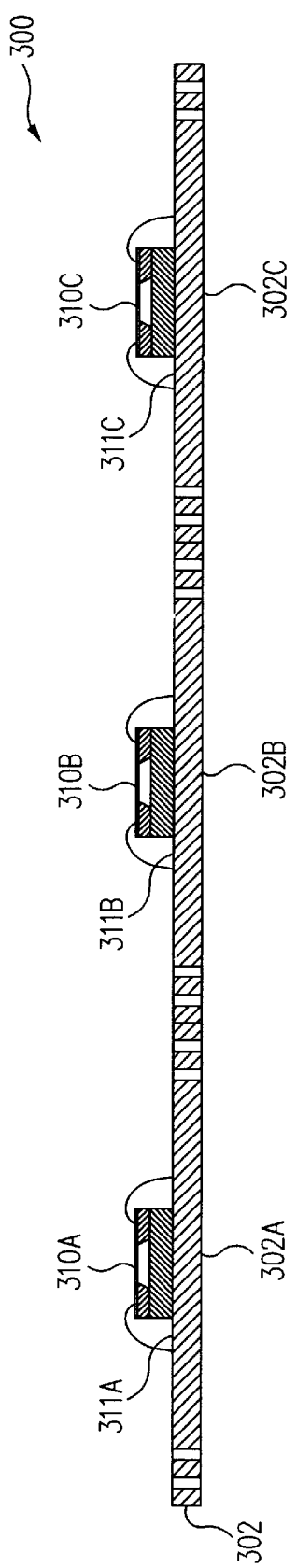
FIG. 3A shows a multi-package array sub-assembly according to the principles of the invention.

In one embodiment of the invention, a plurality of pressure sensor dice (310A, 310B and 310C in FIG. 3A) are attached to an array of pressure sensor sites located on a substrate (FIG. 3A). The pressure sensor dice are then electrically connected to the pressure sensor die attach sites using, in one embodiment, standard wire bond techniques (FIG. 3A).

In one embodiment of the invention, the resulting array of pressure sensor die sub-assemblies (300 in FIG. 3A) is then molded, using a mold tool (370 and 376 in FIGS. 3B to 3I) that closes on three sides of the substrate so that a cavity (362A, 362B and 362C in FIG. 3I) is formed that is open on the fourth side. A first portion of the molding tool (376 in FIGS. 3F to 3I) has a plurality of insert pins (378A, 378B and 378C in FIG. 3F) that close on the outer surface of each pressure sensor die (310A, 310B and 310C In FIG. 3F).

Using the method of the invention, a portion of the outer surface (354A, 354B, and 354C in FIG. 3I) of the micro-machine element of each pressure sensor die (310A, 310B and 310C in FIG. 3I) is left exposed at the bottom of a cavity (362A, 362B and 362C in FIG. 3I) in the molding encapsulant (364 in FIG. 3I). After molding, the exposed outer surface of the micro-machine element (354A, 354B, and 354C in FIG. 3I) is covered with a pressure coupling gel (360A, 360B and 360C in FIG. 3J) applied in the cavity (362A, 362B and 362C in FIG. 3J). Coupling gel 360A, 360B and 360C protects micro-machine elements 354A, 354B and 354C, respectively, from the environment, yet is compressible and is capable of coupling pressure from the external environment to micro-machine elements 354A, 354B and 354C, respectively.

The resulting array of packaged pressure sensors (300A, 300B, and 300C in FIG. 3K) are then sigulated using well know sawing or laser techniques or by snapping a specially formed snap array.

Figure 2A:
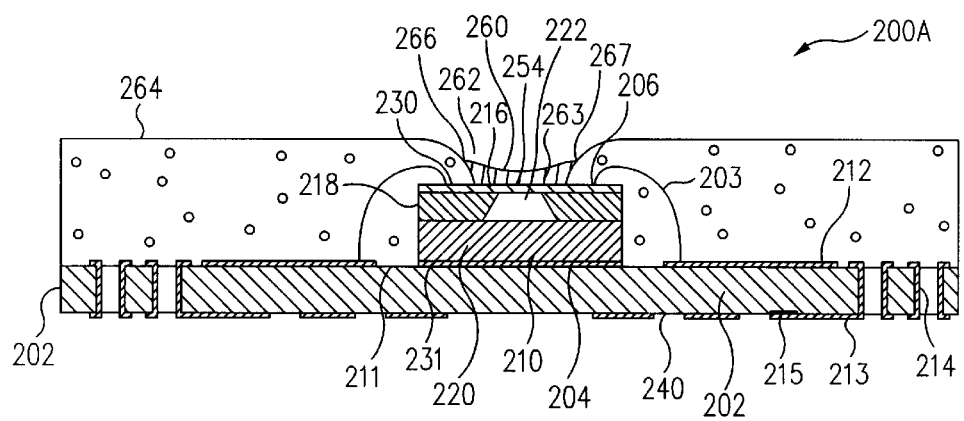
FIG. 2A shows an enlarged cross-sectional view of one embodiment of an absolute sensor die package in accordance with the invention.
Figure 2B:
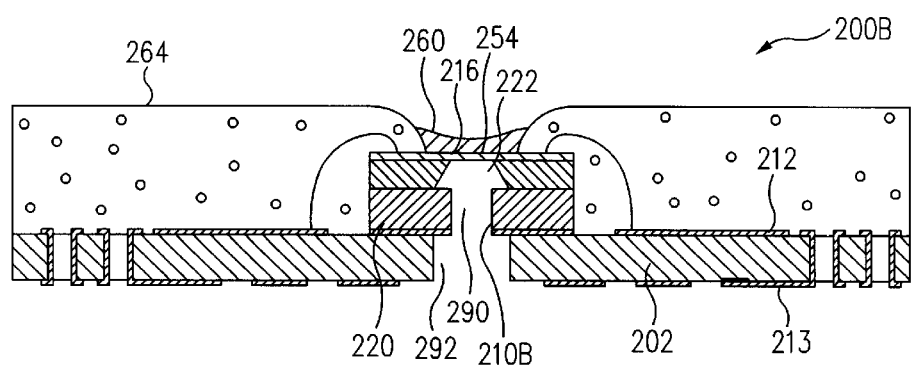
FIG. 2B shows an enlarged cross-sectional view of a differential sensor die package according to another embodiment of the invention.

In another embodiment of the invention, a hole (290 in FIG. 2B) is formed in the array substrate (202 in FIG. 2B) and the pressure sensor substrate (220 in FIG. 2B) to accommodate a differential pressure sensor die (210B in FIG. 2B).

Figure 5A:
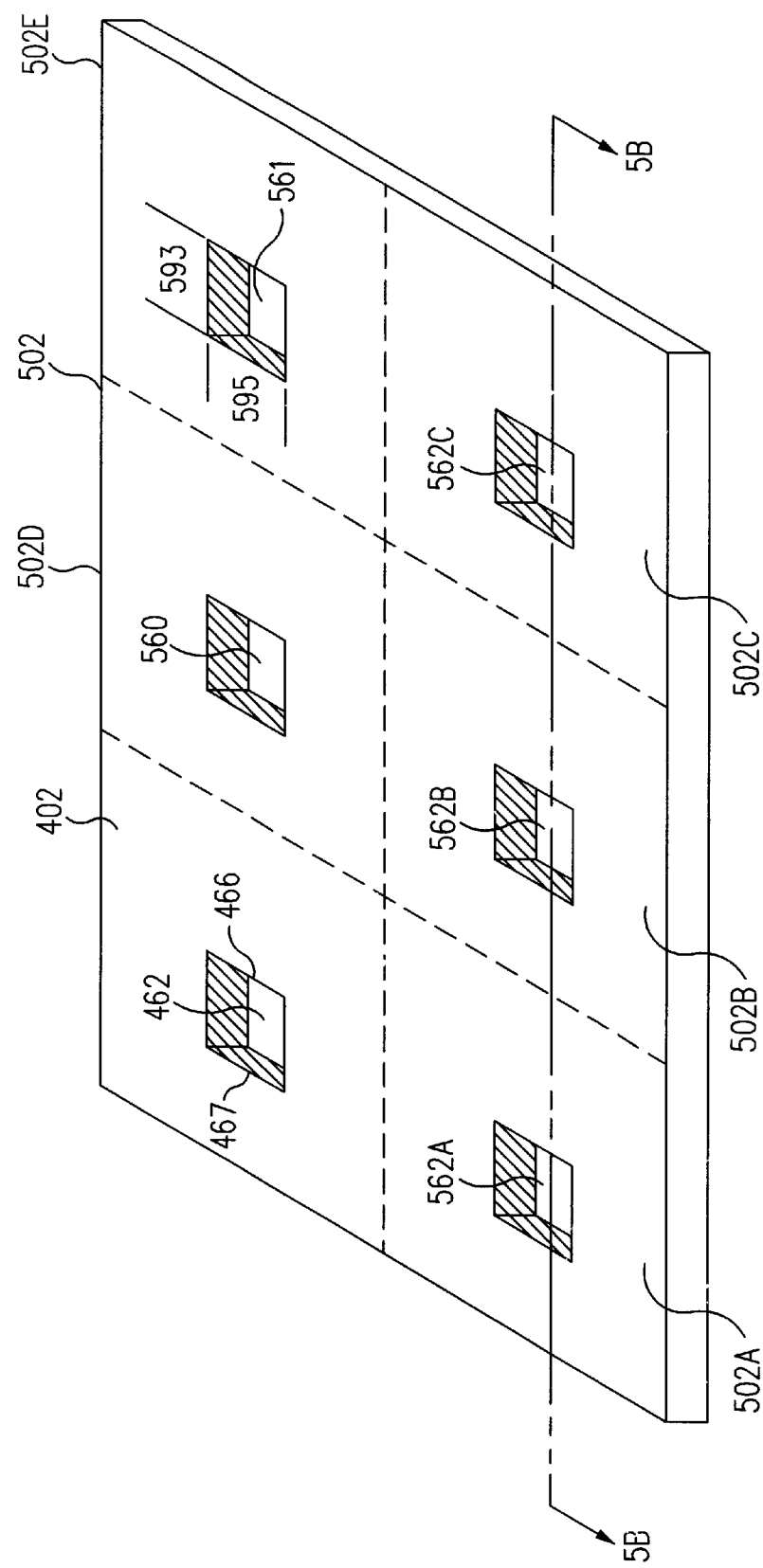
FIG. 5A shows a multi-package array substrate customized according to the principles of the invention to include holes.
Figure 5B:
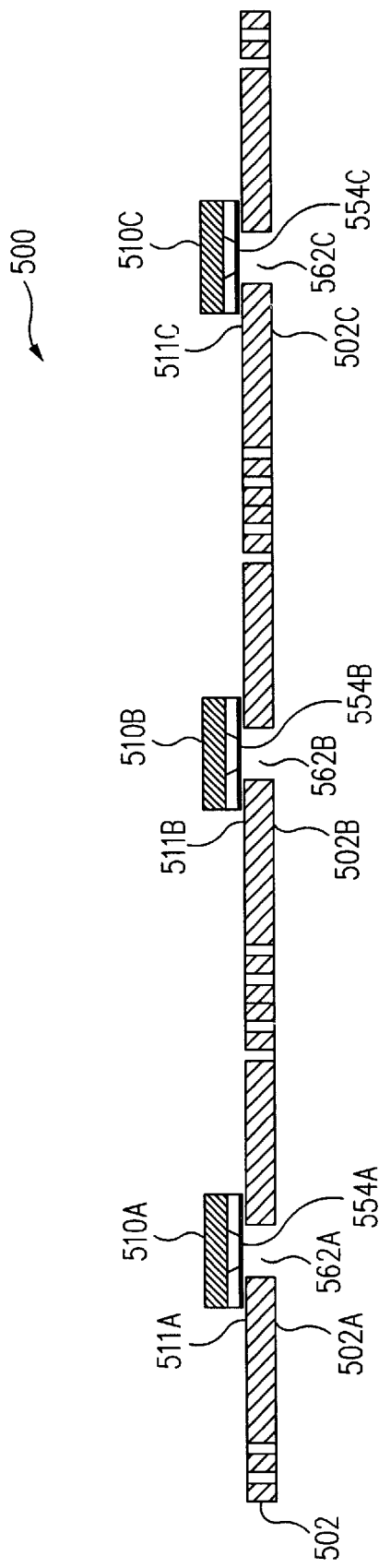
FIG. 5B shows a multi-package array sub-assembly according to the principles of the invention.

In another embodiment of the invention, a custom substrate (502 In FIG. 5A) is formed with a plurality of holes (462, 560, 561, 562A, 562B, and 562C in FIG. 5A) formed, one each, at pressure sensor die mounting sites (402, 502A, 502B, 502C, 502D and 502E in FIG. 5A). A plurality of pressure sensor dice (510A, 510B and 510C in FIG. 5B) is then attached to pressure sensor die mounting sites located on the substrate (FIG. 5B). The pressure sensor dice are then electrically connected to the pressure sensor sites using, in this embodiment, standard flip-chip techniques (FIG. 5B).

The resulting array of pressure sensor die sub-assemblies (511A, 511B and 511C in FIG. 5B) is then molded, using a mold tool (570 and 576 in FIGS. 5C to 5I) that closes on the substrate and is filled with encapsulant (FIGS. 5C to 5I).

Figure 5C:
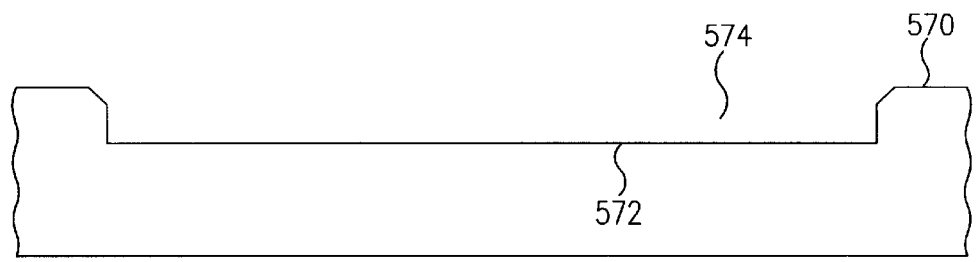
FIG. 5C shows a lower mold section of a mold used to fabricate flip-chip pressure sensor die packages according to the principles of one embodiment of the invention.
Figure 5D:
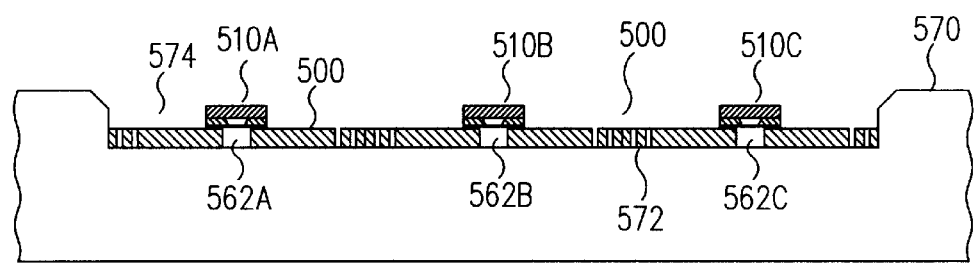
FIG. 5D shows the multi-package array sub-assembly of FIG. 5B positioned in a cavity of the lower mold section on the cavity bottom surface according to the principles of the invention.
Figure 5E:
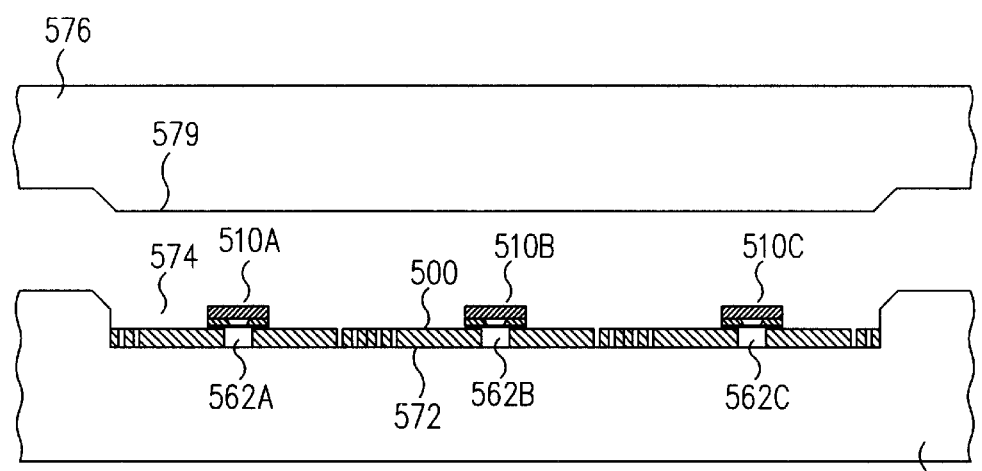
FIG. 5E shows the multi-package array sub-assembly of FIG. 5B positioned in the cavity of the lower mold section on the cavity bottom surface with an upper mold section positioned above the lower mold section according to the principles of the invention.
Figure 5F:
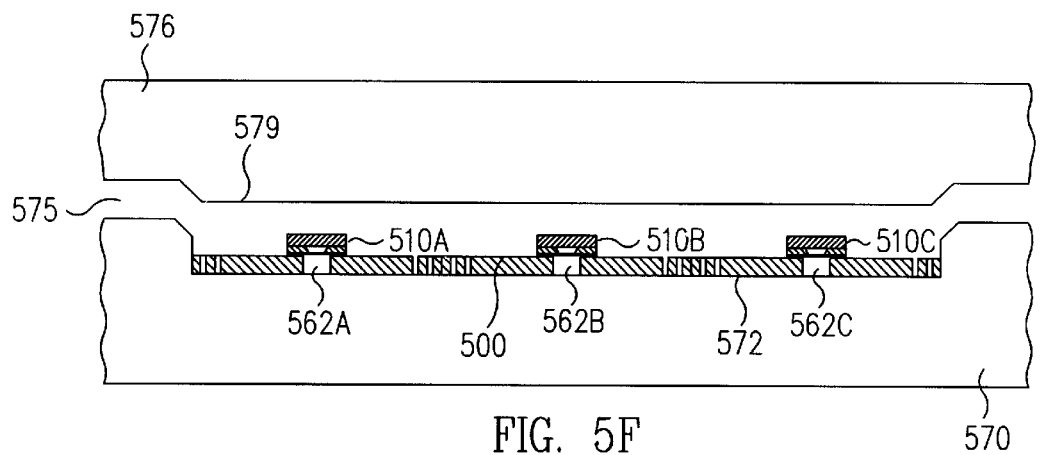
FIG. 5F shows the upper mold section positioned on the lower mold section just prior to introduction of encapsulant according to the principles of the invention.
Figure 5G:
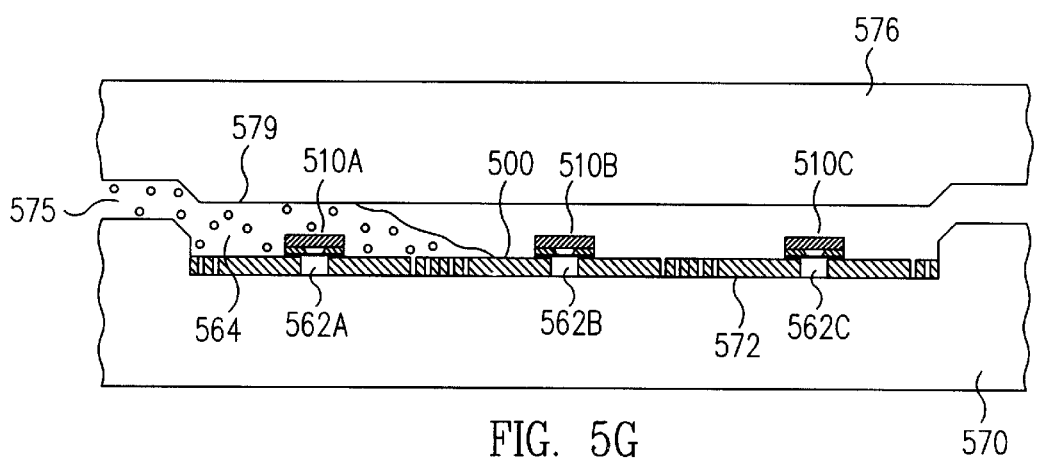
FIG. 5G shows the upper mold section positioned on the lower mold section, as in FIG. 5F, with encapsulant being introduced to the structure according to the principles of the invention.
Figure 5H:
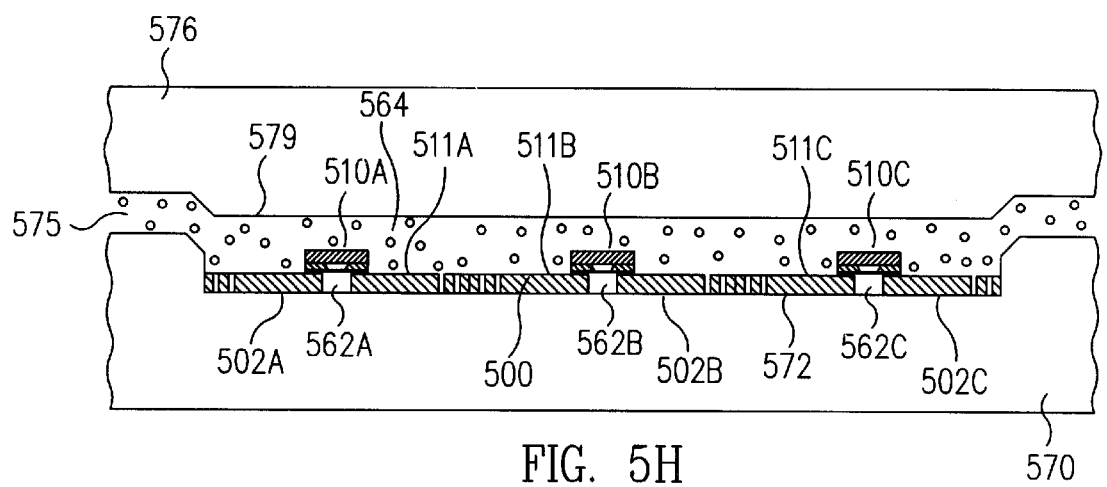
FIG. 5H shows the upper mold section positioned on the lower mold section, as in FIG. 5G, with encapsulant having been introduced and flowed throughout the structure according to the principles of the invention.
Figure 5I:
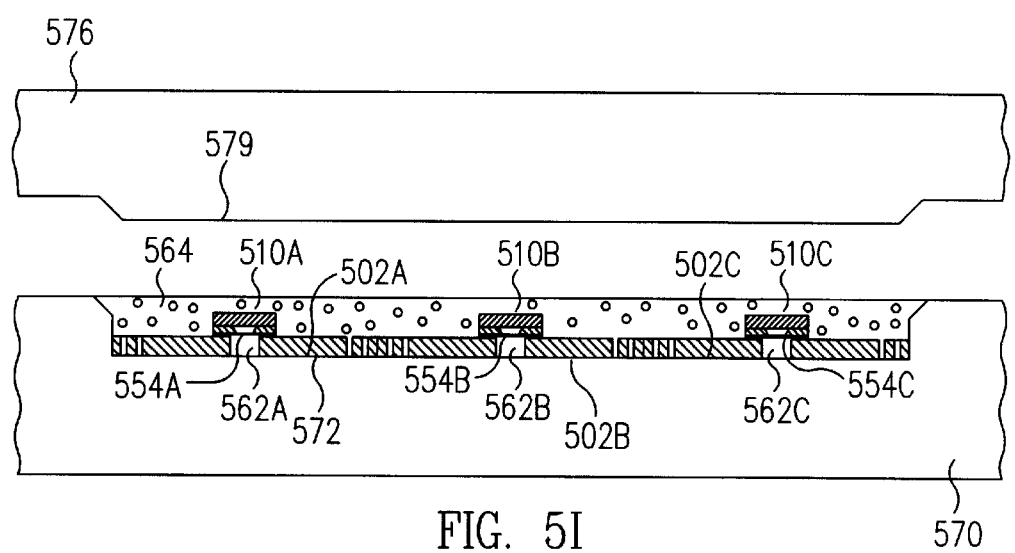
FIG. 5I shows the upper mold section removed from the lower mold section after molding according to the principles of the invention.
Figure 5J:
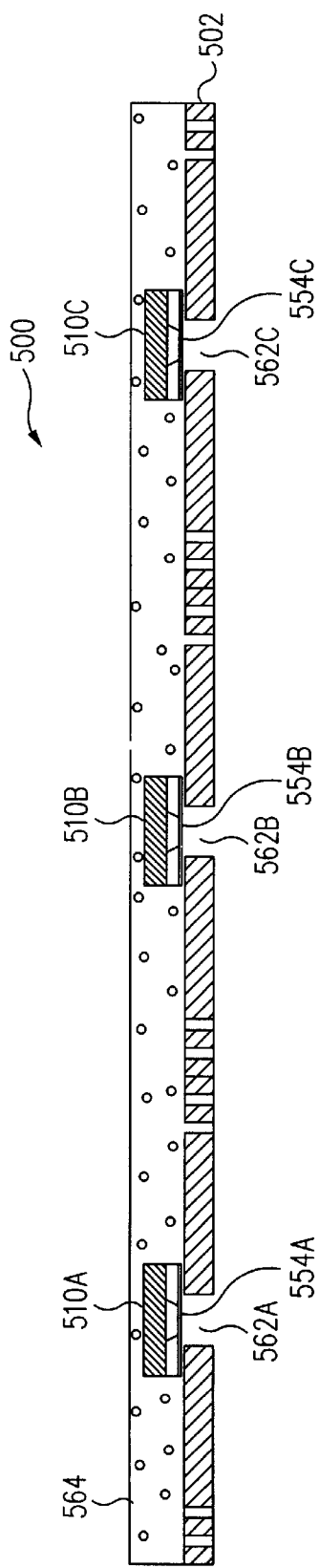
FIG. 5J shows the multi-package array sub-assembly removed from the lower mold section after molding according to the principles of the invention.

Using this embodiment of the method of the invention, a portion of the outer surface (554A, 554B, and 554C in FIG. 5J) of the micro-machine element of each pressure sensor die (510A, 510B and 510C in FIG. 5J) is left exposed at the bottom of the holes (562A, 562B and 562C in FIG. 5J) in the substrate (502 in FIG. 5J). After molding, the exposed outer surface of the micro-machine element (554A, 554B, and 554C in FIG. 5J) is covered with a pressure coupling gel (560A, 560B and 560C in FIG. 5K) applied in the holes (562A, 562B and 562C in FIG. 5K). The resulting array of packaged pressure sensors (500A, 500B, and 500C in FIG. 5L) are then sigulated using well know sawing or laser techniques or by snapping a specially formed snap array.

Figure 4A:
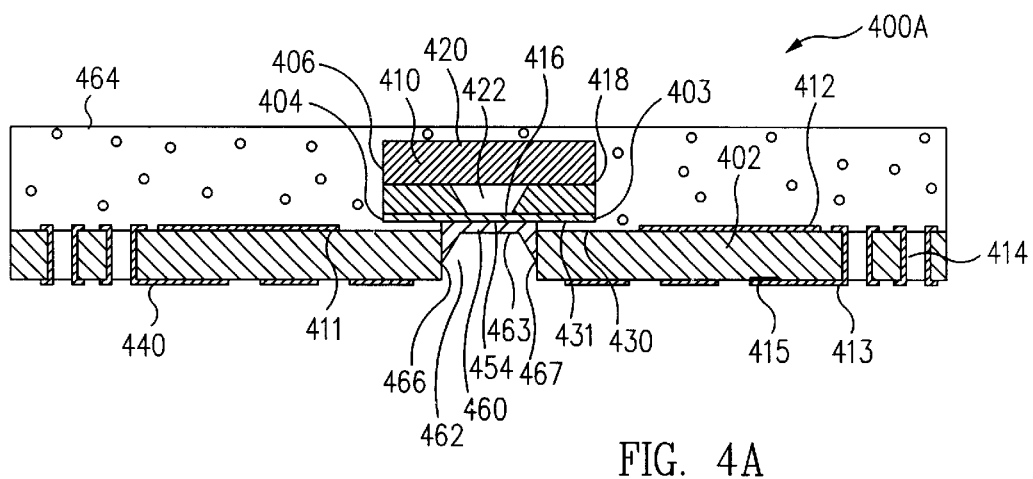
FIG. 4A shows an enlarged cross-sectional view of a flip-chip absolute pressure sensor die package in accordance with the principles of the invention.
Figure 4B:
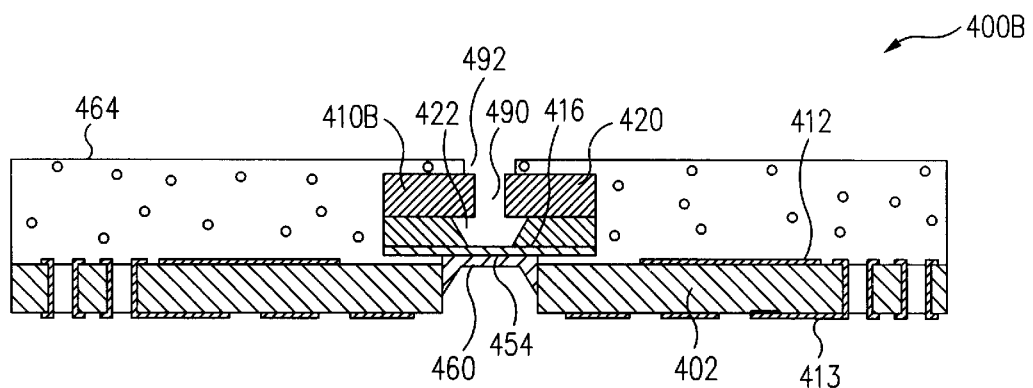
FIG. 4B shows an enlarged cross-sectional view of a flip-chip differential pressure sensor die package according to the principles of another embodiment of the invention.

In another embodiment of the invention, a second hole (490 in FIG. 4B) is formed in the encapsulant (464 in FIG. 4B) and the pressure sensor substrate (420 in FIG. 4B) to accommodate a differential pressure sensor die (410B in FIG. 4B).

Figure 1A:
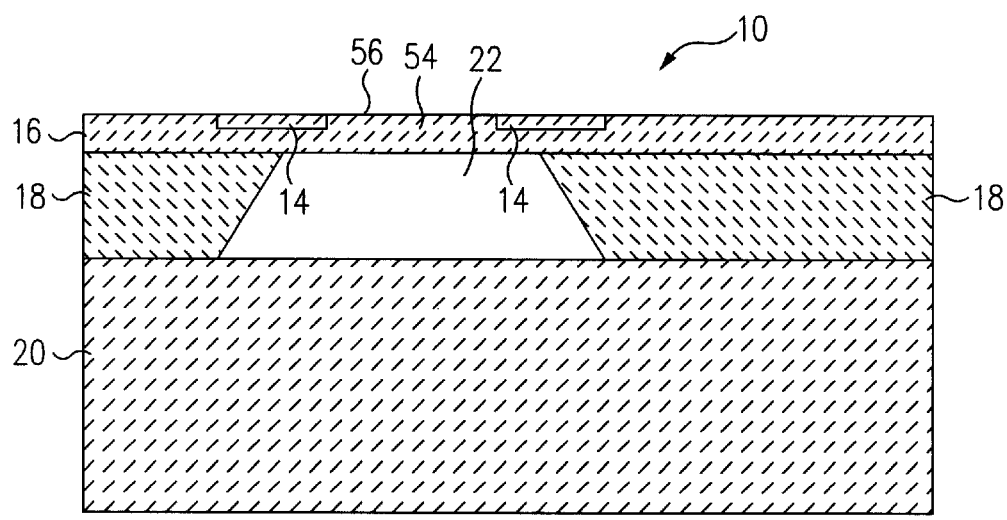
FIG. 1A illustrates an absolute pressure sensor die suitable for use with the present invention.
Figure 1B:
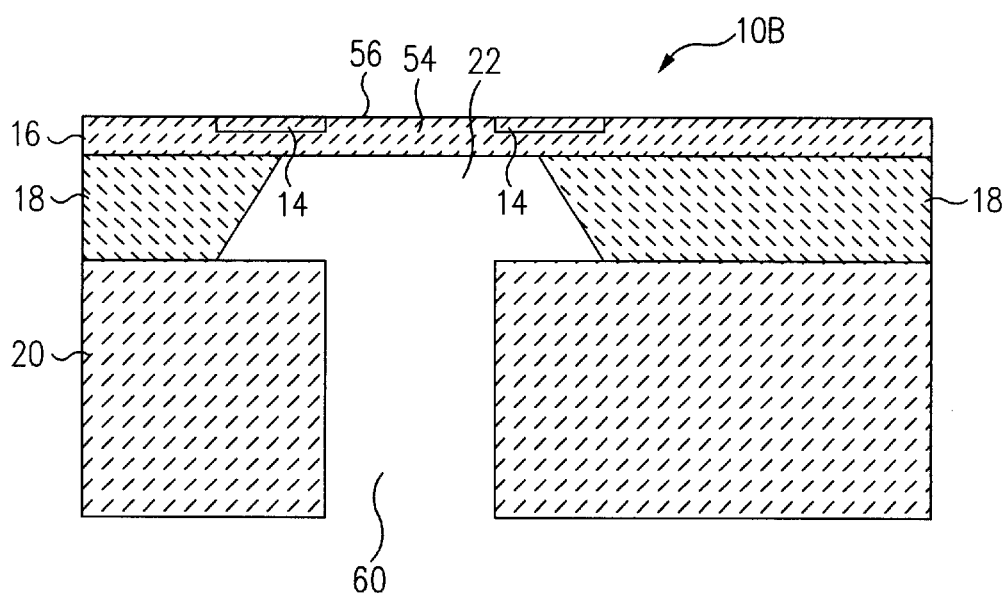
FIG. 1B illustrates a differential pressure sensor die suitable for use with the present invention.
Figure 1C:
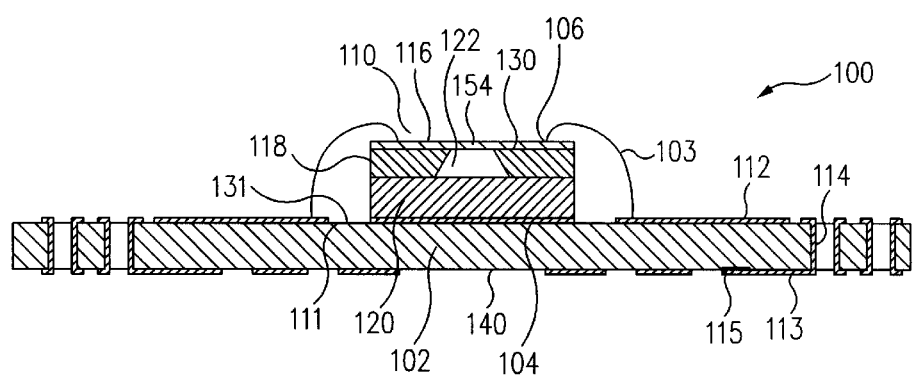
FIG. 1C is an enlarged cross-sectional view of a pressure sensor die mounted on a substrate prior to packaging using prior art methods.

FIG. 2A shows an enlarged cross-sectional view of one embodiment of a pressure sensor die package 200A in accordance with the invention. Pressure sensor die package 200A includes a pressure sensor die 210 mounted on a substrate 202 in a die attach region 231. Like pressure sensor die 10 of FIG. 1A, pressure sensor die 210 (FIG. 2A) includes a pressure sensitive micro-machine element 254 composed of a portion of the epitaxial silicon layer 216. Like pressure sensor die 10 discussed above, pressure sensor die 210 is formed by bonding a substrate 218 to a glass or silicon wafer 220. Substrate 218 includes a cavity 222 such that when substrate 218 is bonded to wafer 220, wafer 220 seals cavity 222. Cavity 222 is positioned directly below micro-machine element 254.

Pressure sensor die 210 is attached to a first surface 211 (a die attach surface) of substrate 202 in die attach region 231 using any one of several well-known adhesives 204. Substrate 202 is typically a printed circuit board (PCB). In one embodiment, electrically conductive pads 206 on first surface 230 of pressure sensor die 210 are connected with electrically conductive bond wires 203 to electrically conductive traces 212 and/or electrically conductive regions (not shown) formed on first surface 211 of substrate 202. In one embodiment of the invention, electrically conductive vias 214 are formed by methods well know to those of skill in the art. Electrically conductive vias 214 are formed through substrate 202, from traces 212 and/or regions on first surface 211 to a second surface (the mounting surface) 240 of substrate 202 which is opposite first surface 211. Electrically conductive traces 213 formed on second surface 240 of substrate 202 extend to electrically conductive contacts or pads 215 formed on second surface 240 of substrate 202. Electrically conductive pads 215 are used to connect substrate 202 and pressure sensor die 210 to a larger system, such as a mother board (not shown), using well known methods such as solder balls, pins, leadless carrier chip (LCC) contacts or other surface mounts.

According to the invention, pressure sensor die package 200A also includes encapsulant 264 that forms, as discussed in more detail below, cavity 262 with sides 266 and 267. In one embodiment of the invention, cavity 262 has length parallel to micro-machine element 254 of approximately 0.5 mm to 1.0 mm (19.7 mils to 39.4 mils) and a depth perpendicular to micro-machine element 254 that varies from application to application from 25 to 100 microns. Cavity 262 is positioned directly over micro-machine element 254. A bottom portion 263 of cavity 262 is filled, according to the invention, with coupling gel 260. Coupling gel 260 is, in one embodiment, typically a silicon gel such as those produced by Dow Corning and well known to those of skill in the art.

FIG. 2B shows an enlarged cross-sectional view of a pressure sensor die package 200B according to another embodiment of the invention. In FIG. 2B, pressure sensor die 210B is a differential pressure sensor die. The operation of differential pressure sensors and differential pressure sensor dice, such as pressure sensor die 210B, is well known to those of skill in the art. Therefore, the operation of differential sensor die 210B will not be discussed in detail herein to avoid detracting from the invention.

Pressure sensor die package 200B is identical to pressure sensor die package 200A, discussed above with respect to FIG. 2A, except that pressure sensor die package 200B includes a die hole 290 through wafer 220 to cavity 222 of sensor die 210 and a substrate through hole 292 through substrate 202 which is at least partially aligned with die hole 290. Hole 290 die hole 290 and substrate through hole 292 allow pressure sensor die 210 to act as a differential pressure sensor.

In accordance with the present invention, a plurality of pressure sensor die packages, such as pressure sensor die package 200A (FIG. 2A) or pressure sensor die package 200B (FIG. 2B), are fabricated simultaneously to minimize the cost associated with each individual die package. FIGS. 3A to 3L show the significant steps involved in making one embodiment of a pressure sensor die package according to the invention. In FIGS. 3A to 3L, a method for making an absolute pressure sensor die package, such as pressure sensor die package 200A in FIG. 2A, is shown in detail. However, those of skill in the art will recognize that by using a custom substrate, such as substrate 502 in FIG. 5A (discussed below), or by cutting through hole 292 in a standard substrate, such as substrate 202 in FIG. 3A, the method of the invention can be used to fabricate a differential pressure sensor package, such as differential pressure sensor package 200B in FIG. 2B. A method for making an absolute pressure sensor package is discussed in detail below, and shown in FIGS. 3A to 3L, for simplicity sake only and to keep the present discussion as brief and simple as possible. Consequently, the choice of this one embodiment of the invention for the discussion below is not meant to limit the scope of the present invention to this embodiment.

FIG. 3A shows a multi-package array sub-assembly 300. Multi-package array sub-assembly 300 includes substrate 302 made up of individual package substrate sections 302A, 302B and 302C. Individual package substrate sections 302A, 302B and 302C are identical to substrate 202 of FIG. 2A discussed above. As shown in FIG. 3A, each individual package substrate section 302A, 302B and 302C has a pressure sensor die 310A, 310B and 310C, respectively, mounted on a first surface 311A, 311B and 311C, respectively.

Figure 3B:
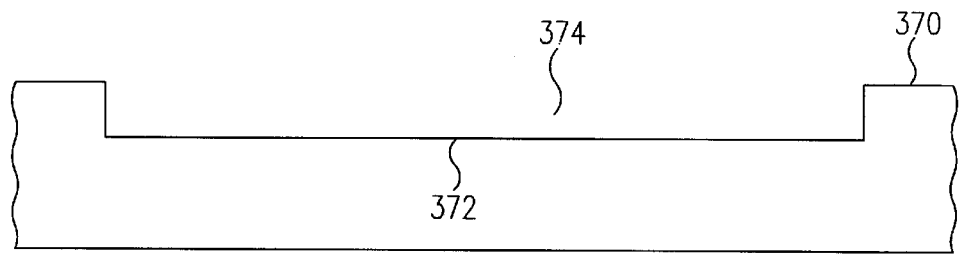
FIG. 3B shows a lower mold section of a mold used to fabricate pressure sensor die packages according to one embodiment of the invention.

FIG. 3B shows a lower mold section 370 of a custom mold used to fabricate pressure sensor die packages according to one embodiment of the invention. Lower mold section 370 includes cavity 374 with cavity bottom surface 372.

Figure 3C:
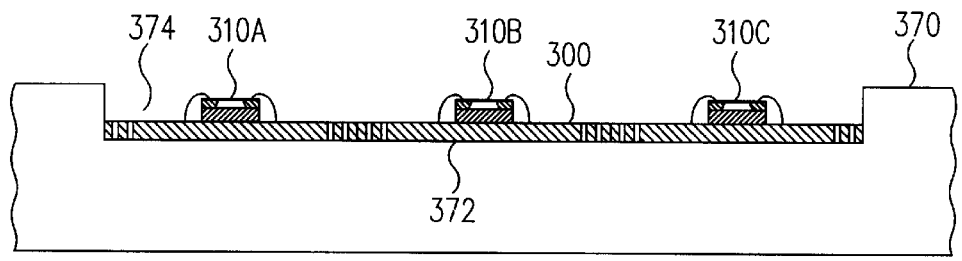
FIG. 3C shows the multi-package array sub-assembly of FIG. 3A positioned a cavity of the lower mold section of FIG. 3B on a cavity bottom surface according to the principles of the invention.

FIG. 3C shows multi-package array sub-assembly 300 positioned in cavity 374 of lower mold section 370 on cavity bottom surface 372.

Figure 3D:
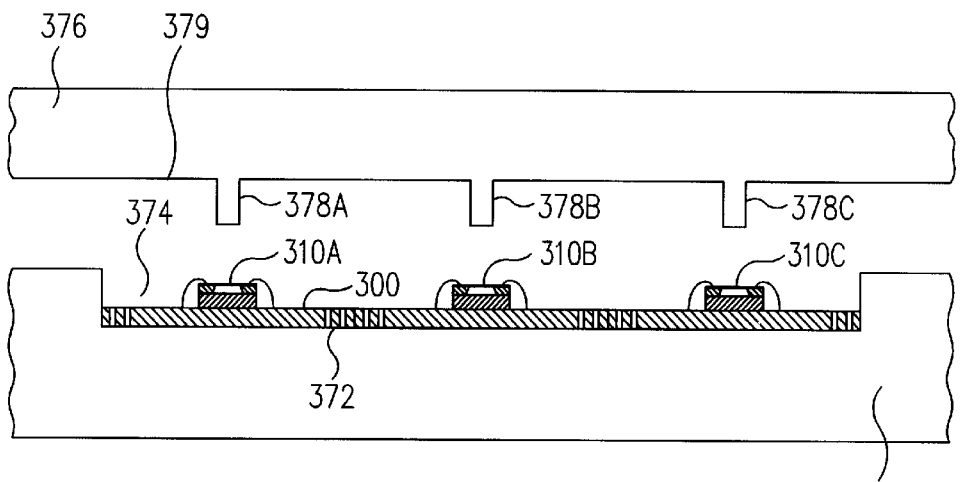
FIG. 3D shows the multi-package array sub-assembly of FIG. 3A positioned in the cavity of the lower mold section on the cavity bottom surface with an upper mold section positioned above the lower mold section according to the principles of the invention.

FIG. 3D shows multi-package array sub-assembly 300 positioned in cavity 374 of lower mold section 370 on cavity bottom surface 372 with upper mold section 376 positioned above lower mold section 370. Upper mold section 376 includes pins 378A, 378B and 378C that extend from surface 379 of upper mold section 376.

Figure 3E:
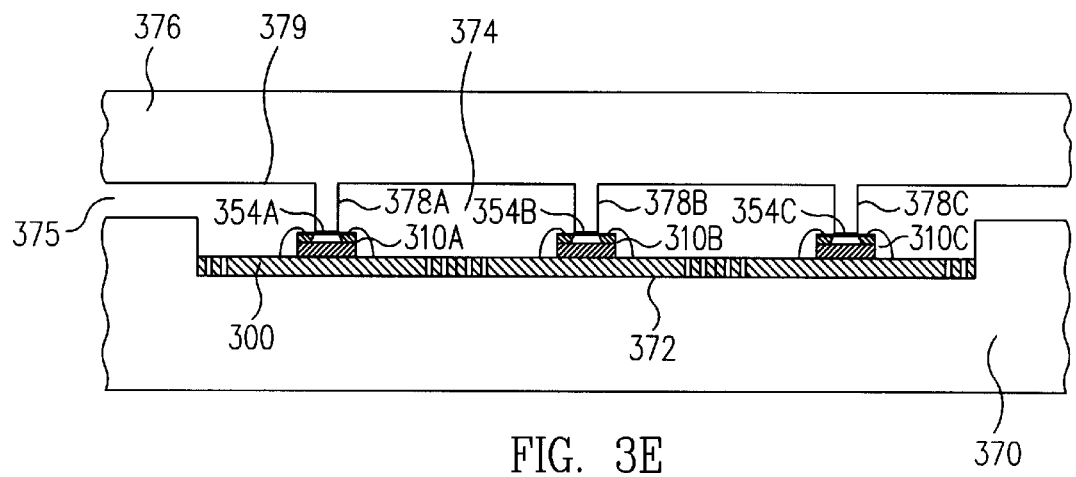
FIG. 3E shows the upper mold section positioned on the lower mold section just prior to introduction of encapsulant according to the principles of the invention.

FIG. 3E shows upper mold section 376 positioned on lower mold section 370 just prior to introduction of encapsulant. As shown in FIG. 3E, when upper mold section 376 is in place, pins 378A, 378B and 378C of upper mold section 376 make physical contact with micro-machine elements 354A, 354B and 354C, respectively, of pressure sensor dice 310A, 310B and 310C, respectively. In addition, when upper mold section 376 is in place on lower mold section 370, a channel 375 is formed for the introduction of liquid encapsulant.

Figure 3F:
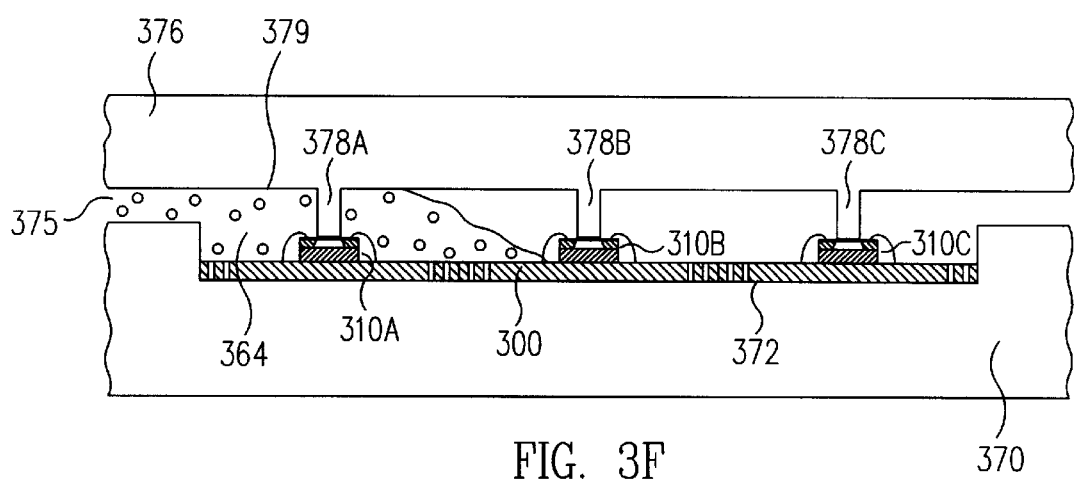
FIG. 3F shows the upper mold section positioned on the lower mold section, as in FIG. 3E, with encapsulant being introduced to the structure according to the principles of the invention.

FIG. 3F shows upper mold section 376 positioned on lower mold section 370, as in FIG. 3E, with encapsulant 364 being introduced to the structure.

Figure 3G:
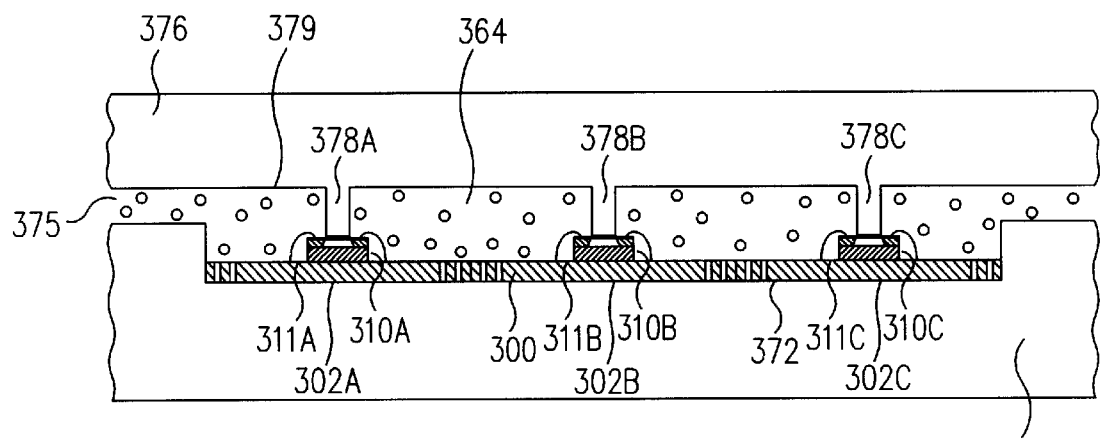
FIG. 3G shows the upper mold section positioned on the lower mold section, as in FIG. 3F, with encapsulant having been introduced and flowed throughout the structure according to the principles of the invention.

FIG. 3G shows upper mold section 376 positioned on lower mold section 370, as in FIG. 3F, with encapsulant 364 having been introduced and flowed throughout the structure. As can be seen in FIG. 3G, encapsulant 364 covers the entire first surfaces 311A, 311B and 311C of individual package substrate sections 302A, 302B, 302C, respectively, as well as the majority of pressure sensors 310A, 310B and 310C. Importantly, however, encapsulant 364 is prevented for covering a first region of the first surfaces of pressure sensors 310A, 310B and 310C including micro-machine elements 354A, 354B and 354C by pins 378A, 378B and 378C, respectively.

Figure 3H:
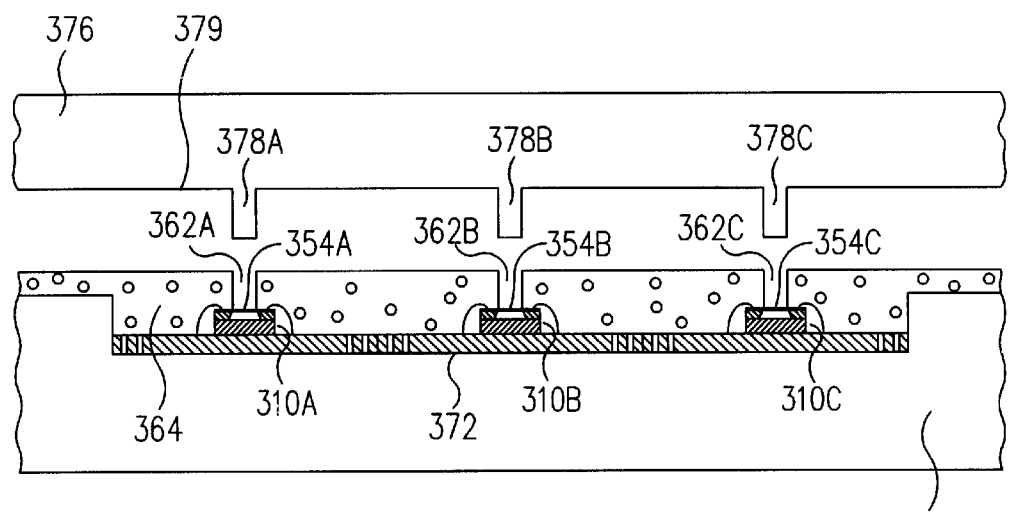
FIG. 3H shows the upper mold section removed from the lower mold section after molding according to the principles of the invention.

FIG. 3H shows upper mold section 376 removed from lower section 370 after molding. As can be seen in FIG. 3H, after molding according to the invention, cavities 362A, 362B and 362C are formed in encapsulant 364 such that a first region of the first surfaces of pressure sensors 310A, 310B and 310C including micro-machine elements 354A, 354B and 354C remain exposed at the bottom of cavities 362A, 362B and 362C, respectively.

FIG. 3I shows multi-package array sub-assembly 300 removed from lower mold section 370 (FIG. 3G) after molding. As seen in FIG. 3I, after molding, each pressure sensor die 310A, 310B and 310C has a first region of the first surfaces of pressure sensors 310A, 310B and 310C including micro-machine element 354A, 354B and 354C, respectively, exposed to the environment at the bottom of cavities 362A, 362B and 362C, respectively.

FIG. 3J shows multi-package array sub-assembly 300 of FIG. 3I with a coupling gel 360A, 360B and 360C applied to, and filling a portion of, cavities 362A, 362B and 362C, respectively. Coupling gel 360A, 360B and 360C protects micro-machine elements 354A, 354B and 354C, respectively, from the environment, yet is compressible and is capable of coupling pressure from the external environment to micro-machine elements 354A, 354B and 354C, respectively.

Figure 3K:
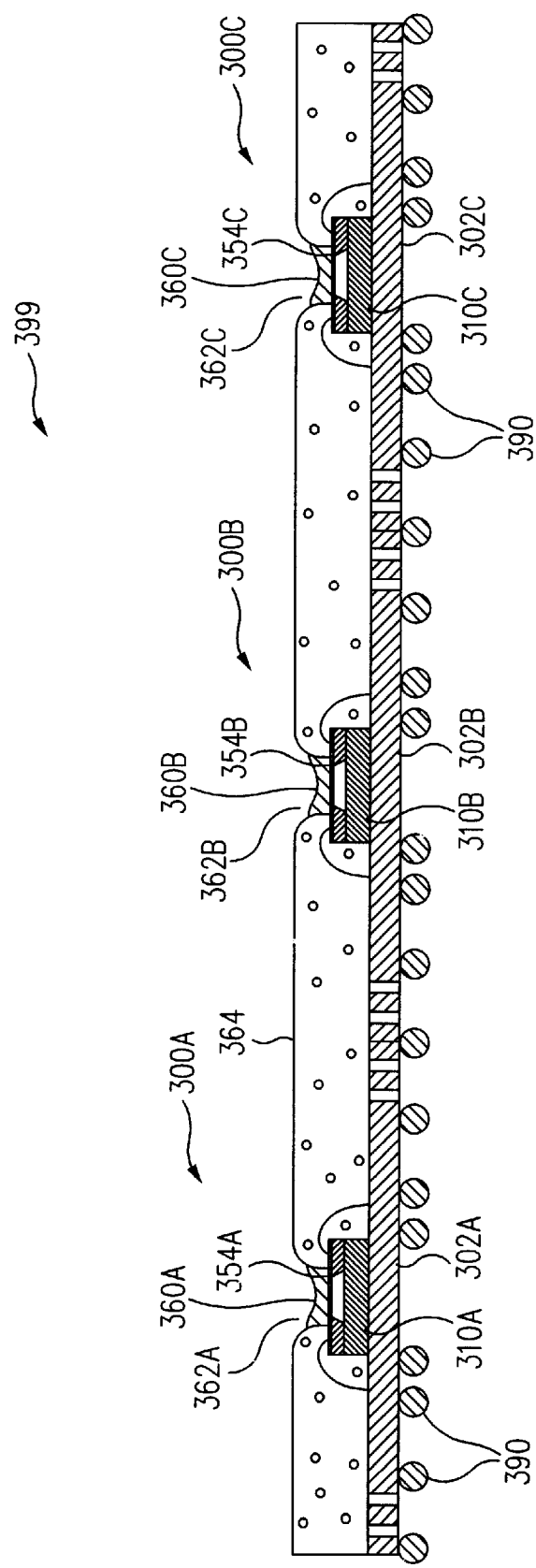
FIG. 3K shows the multi-package array sub-assembly of FIG. 3J with solder balls attached, thereby forming a ball grid array pressure sensor die array according to the principles of the invention.

FIG. 3K shows multi-package array sub-assembly 300 of FIG. 3J with solder balls 390 attached, thereby forming ball grid array pressure sensor die package array 399 including ball grid array pressure sensor packages 300A, 300B and 300C.

Figure 3L:
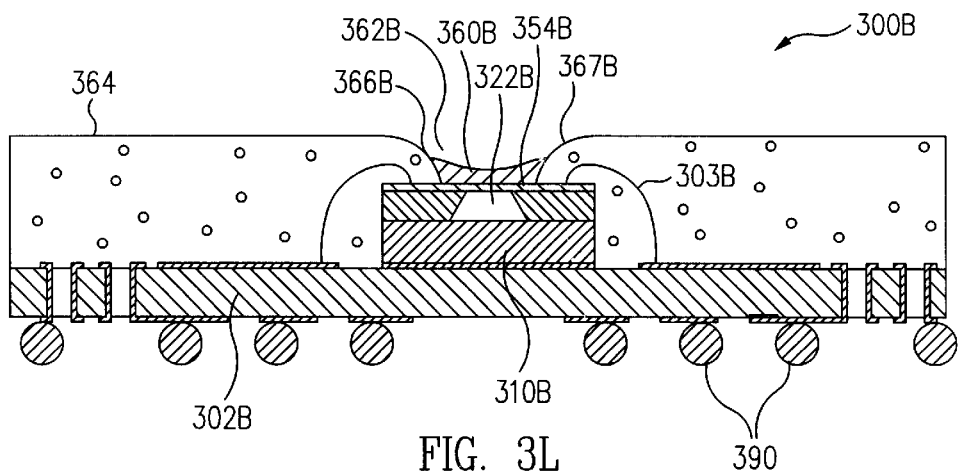
FIG. 3L shows a ball grid array pressure sensor die package of FIG. 3K after singulation from the multi-package array sub-assembly according to the principles of the invention.

FIG. 3L shows ball grid array pressure sensor package 300B of FIG. 3K after singulation from multi-package array sub-assembly 300.

Singulation of ball grid array pressure sensor die package 300B is achieved by any singulation method such as sawing, laser or snapping methods.

FIG. 4A shows an enlarged cross-sectional view of another embodiment of a pressure sensor die package 400A in accordance with the invention. Pressure sensor die package 400A includes a pressure sensor die 410 mounted on a substrate 402. Like pressure sensor die 10 of FIG. 1A, pressure sensor die 410 (FIG. 4A) includes a pressure sensitive micro-machine element 454 composed of a portion of the epitaxial silicon layer 416. Like pressure sensor die 10 discussed above, pressure sensor die 410 is formed by bonding a substrate 418 to a glass or silicon wafer 420. Substrate 418 includes a cavity 422 such that when substrate 418 is bonded to wafer 420, wafer 420 seals cavity 422. Cavity 422 is positioned directly below micro-machine element 454.

In the embodiment of the invention shown in FIG. 4A, pressure sensor die 410 is attached to a first surface 411 (a die attach surface) of substrate 402 in a "flip-chip" configuration. Flip-chip configurations are well known to those of skill in the art and are therefore not discussed in detail here to avoid detracting from the invention. Once pressure sensor die 410 is attached to first surface 411 of substrate 402 in die attach region 431 in the flip-chip configuration, an under fill material 404 is applied between first surface 411 and pressure sensor die 410. Under filling and under fill materials are well known to those of skill in the art.

Substrate 402 is typically a printed circuit board (PCB) that, as discussed in more detail below, is customized according to the invention for flip-chip applications of pressure sensor die 410. In particular, substrate 402 includes pre-cut hole 462 with sides 466 and 467. As discussed in more detail below, in one embodiment of the invention, hole 462 has a length of 1.0 mm (39.4 mils) and a width of 1.0 mm (39.4 mils). Hole 462 is positioned directly over micro-machine element 454 and a first region of a first surface 430 of pressure sensor die 410. In addition, a bottom portion 463 of hole 462 is, according to the invention, filled with coupling gel 460. Coupling gel 460 protects micro-machine element 454 from the environment, yet is compressible and is capable of coupling pressure from the external environment to micro-machine element 454. Coupling gel 460 is, in one embodiment, typically a silicon gel such as those produced by Dow Corning and well known to those of skill in the art.

In this embodiment of the invention, electrically conductive pads 406 first surface 430 of pressure sensor die 410 are connected directly to electrically conductive traces 412 and/or electrically conductive regions (not shown) formed on first surface 411 of substrate 402. In one embodiment of the invention, electrically conductive vias 414 are formed through substrate 402, from traces 412 and/or regions on first surface 411 to a second surface (the mounting surface) 440 of substrate 402 which is opposite first surface 411.

Electrically conductive traces 413 formed on second surface 440 of substrate 402 extend to electrically conductive contacts or pads 415 formed on second surface 440 of substrate 402. Electrically conductive pads 415 are used to connect substrate 402 and pressure sensor die 410 to a larger system, such as a mother board (not shown), using well known methods such as solder balls, pins, leadless carrier chip (LCC) contacts or other surface mounts.

According to the invention, pressure sensor die package 400A also includes encapsulant 464 that protects pressure sensor die 410 and first surface 411 of substrate 402 from the elements.

FIG. 4B shows an enlarged cross-sectional view of a pressure sensor die package 400B according to another embodiment of the invention. In FIG. 4B, pressure sensor die 410B is a differential pressure sensor die. The operation of differential pressure sensors and differential pressure sensor dice, such as pressure sensor die 410B, is well known to those of skill in the art. Therefore, the operation of differential sensor die 410B will not be discussed in detail herein to avoid detracting from the invention.

Pressure sensor die package 400B is identical to pressure sensor die package 400A, discussed above with respect to FIG. 4A, except that pressure sensor die package 400B includes a die hole 490 through wafer 420 to cavity 422 of sensor die 410 and encapsulant through hole 492 through encapsulant 464 which is at least partially aligned with die hole 490. Through hole 490 allows pressure sensor die 410 to act as a differential pressure sensor package.

In accordance with the present invention, a plurality of pressure sensor die packages, such as pressure sensor die package 400A (FIG. 4A) and pressure sensor die package 400B (FIG. 4B), are fabricated simultaneously to minimize the cost associated with each individual package. FIGS. 5A to 5M show the significant steps involved for making one embodiment of a pressure sensor package according to the invention. In FIGS. 5A to 3M, a method for making an absolute pressure sensor die package, such as pressure sensor die package 400A in FIG. 4A, is discussed in detail.

However, those of skill in the art will recognize that by using a custom mold, such as mold 370 and 376 in FIG. 3E (discussed above), or by forming cutting an encapsulation through hole 492 in encapsulant 464 in FIG. 4B, the method of the invention can be used to fabricate a differential pressure sensor die package, such as differential pressure sensor die package 400B in FIG. 4B. A method for making an absolute pressure sensor package is discussed in detail below, and shown in FIGS. 5A to 5M, for simplicity sake only and to keep the present discussion as brief and simple as possible. Consequently, the choice of this one embodiment of the invention for the discussion below is not meant to limit the scope of the present invention to this embodiment.

FIG. 5A shows a multi-package array substrate 502 customized according to the invention to include substrate holes 462, 560, 561, 562A, 562B and 562C. In one embodiment of the invention, multi-package array substrate 502 is a PCB and includes substrate 402 of FIG. 4A with hole 462 having sides 467 and 466. In addition, multi-package array substrate 502 includes substrates 502A, 502B, 502C, 502D and 502E that are discussed in more detail below.

Holes 462, 560, 561, 562A, 562B and 562C are formed by methods well know to those of skill in the art such as punching the holes bore firing. In one embodiment of the invention, hole,s 462, 560, 561, 562A, 562B and 562C have a length 593 of 1.0 mm (39.4 mils) and a width 595 of 1.0 mm (39.4 mils).

Typically, multi-package array substrate 502 includes a nine by nine (9×9) array of substrates such as substrates 402, 502A, 502B, 502C, 502D and 502E. However, multi-package array substrate 502 can include any number of substrates such as substrates 402, 502A, 502B, 502C, 502D and 502E. Only six such substrates are shown in FIG. 5A for simplicity sake.

FIG. 5B shows a multi-package array sub-assembly 500. Multi-package array sub-assembly 500 includes multi-package array substrate 502, as seen along line 5B—5B of FIG. 5A, made up of individual package substrates 502A, 502B and 502C. Individual package substrates 502A, 502B and 502C are identical to substrate 402 of FIG. 4A discussed above. As shown in FIG. 5B, each individual package substrate 502A, 502B and 502C has a pressure sensor die 510A, 510B and 510C, respectively, mounted on a first surface 511A, 511B and 511C, respectively, in a flip-chip configuration.

FIG. 5C shows a lower mold section 570 of a mold used to fabricate pressure sensor die packages according to one embodiment of the invention. Lower mold section 570 includes cavity 574 with cavity bottom surface 572.

FIG. 5D shows multi-package array sub-assembly 500 positioned in cavity 574 of lower mold section 570 on cavity bottom surface 572.

FIG. 5E shows multi-package array sub-assembly 500 positioned in cavity 574 of lower mold section 570 on cavity bottom surface 572 with upper mold section 576 positioned above lower mold section 570.

FIG. 5F shows upper mold section 576 positioned on lower mold section 570 just prior to introduction of encapsulant. As shown in FIG. 5F, when upper mold section 576 is in place on lower mold section 570, a channel 575 is formed for the introduction of liquid encapsulant.

FIG. 5G shows upper mold section 576 positioned on lower mold section 570, as in FIG. 5F, with encapsulant 564 being introduced to the structure.

FIG. 5H shows upper mold section 576 positioned on lower mold section 570, as in FIG. 5G, with encapsulant 564 having been introduced and flowed throughout the structure. As can be seen in FIG. 5H encapsulant 564 covers the entire first surfaces 511A, 511B and 511C of individual package substrates 502A, 502B, 502C, respectively, as well as pressure sensor dice 510A, 510B and 510C.

FIG. 5I shows upper mold section 576 removed from lower section 570 after molding. As can be seen in FIG. 5I, after molding according to the invention, holes 562A, 562B and 562C of substrates 502A, 502B 502C are positioned such that micro-machine elements 554A, 554B and 554C remain exposed at the bottom of holes 562A, 562B and 562C, respectively.

FIG. 5J shows multi-package array sub-assembly 500 removed from lower mold section 570 (FIG. 5H) after molding. As seen in FIG. 5J, after molding, each pressure sensor die 510A, 510B and 510C has its micro-machine element 554A, 554B and 554C, respectively, exposed to the environment at the bottom of holes 562A, 562B and 562C, respectively.

Figure 5K:
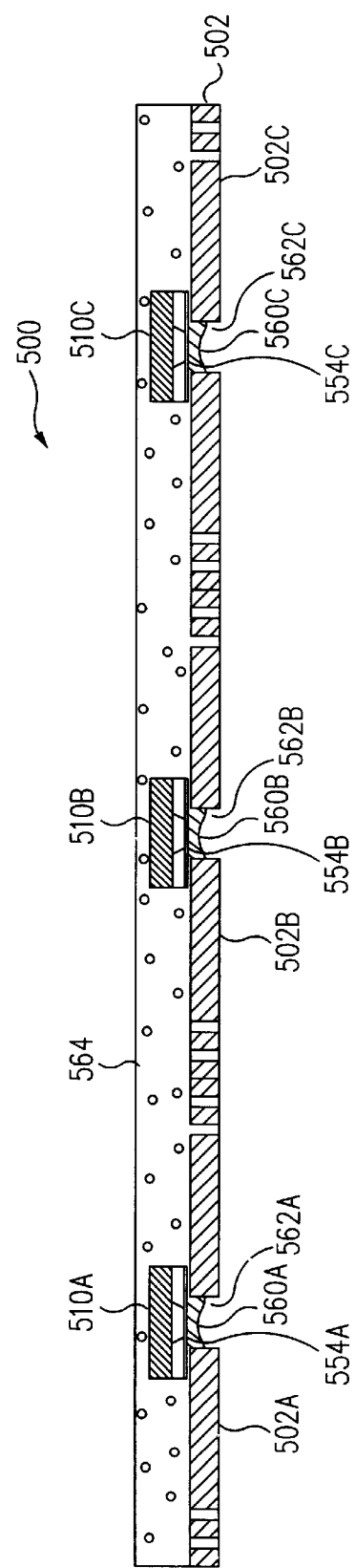
FIG. 5K shows the multi-package array sub-assembly of FIG. 5J with a coupling gel applied to, and filling a portion of, the holes according to the principles of the invention.

FIG. 5K shows multi-package array sub-assembly 500 of FIG. 5J with a coupling gel 560A, 560B and 560C applied to, and filling a portion, of holes 562A, 562B and 562C, respectively. Coupling gel 560A, 560B and 560C protects micro-machine elements 554A, 554B and 554C, respectively, from the environment, yet is compressible and is capable of coupling pressure from the external environment to micro-machine elements 554A, 554B and 554C, respectively.

Figure 5L:
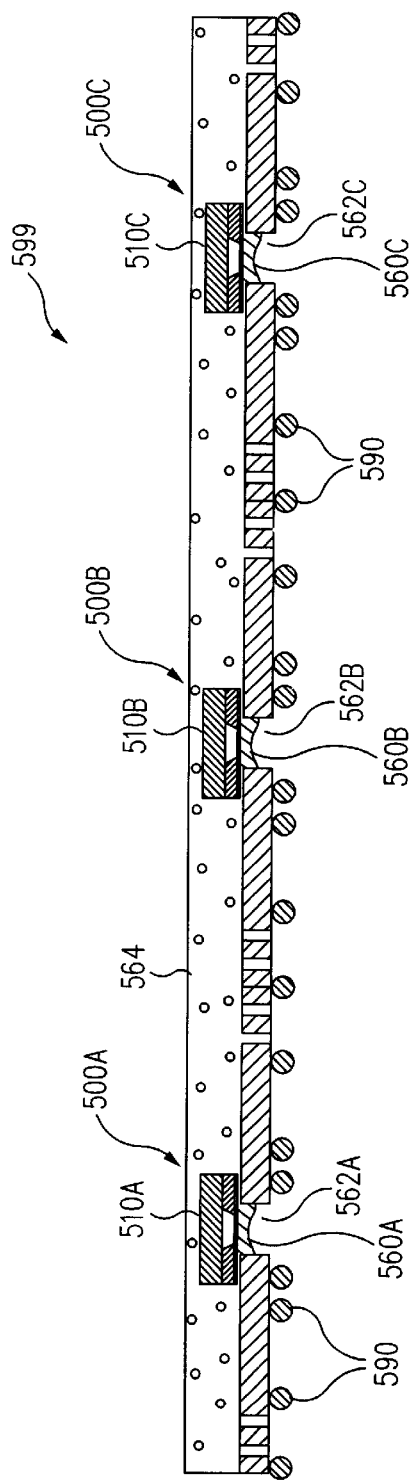
FIG. 5L shows the multi-package array sub-assembly of FIG. 5K with solder balls attached, thereby forming a flip-chip ball grid array pressure sensor die package array according to the principles of the invention.

FIG. 5L shows multi-package array sub-assembly 500 of FIG. 5K with solder balls 590 attached, thereby forming ball grid array pressure sensor die array 599 including ball grid array pressure sensor die packages 500A, 500B and 500C.

Figure 5M:
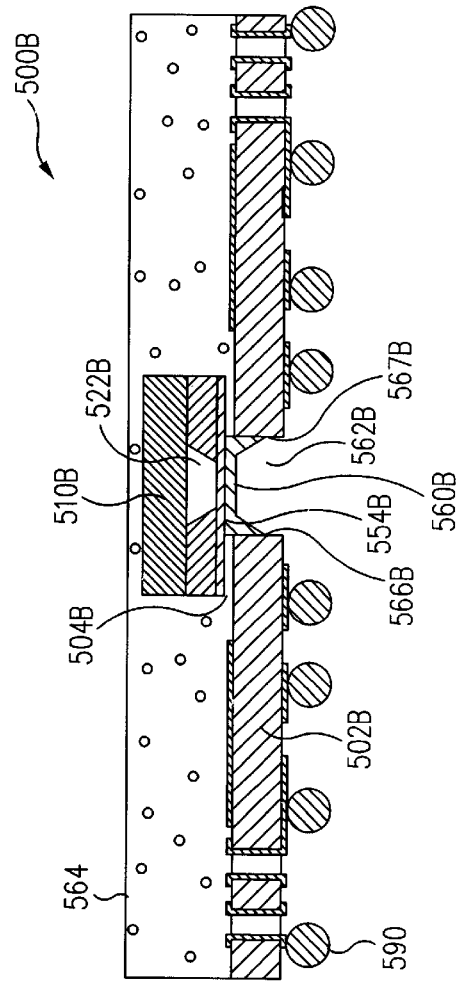
FIG. 5M shows ball grid array pressure sensor die package of FIG. 5L after singulation from multi-package array sub-assembly according to the principles of the invention.

FIG. 5M shows ball grid array pressure sensor die package 500B of FIG. 5L after singulation from multi-package array sub-assembly 500.

Singulation of ball grid array pressure sensor die package 500B is achieved by any singulation method such as sawing, laser or snapping methods.

This Application is related to: co-filed U.S. patent application Ser. No. 09/754,229 entitled "METHOD FOR FORMING A BOND WIRE PRESSURE SENSOR PACKAGE", and naming Steven Webster as inventor; co-filed U.S. patent application Ser. No. 09/754,487 entitled "FLIP CHIP PRESSURE SENSOR PACKAGE", and naming Steven Webster as inventor; and co-filed U.S. patent application Ser. No. 09/754,239 entitled "METHOD FOR FORMING A FLIP CHIP PRESSURE SENSOR PACKAGE", and naming Steven Webster as inventor; all of which are assigned to the assignee of the present invention and are incorporated herein, in their entirety, by reference for all purposes.

The drawings and the forgoing description gave examples of the present invention. The scope of the present invention, however, is by no means limited by these specific examples. Numerous variations, whether explicitly given in the specification or not, such as differences in structure, dimension, and use of material, are possible.

For instance, as discussed above, FIGS. 3A to 3L and FIGS. 5A to 5M, show a method for making an absolute pressure sensor die package. However, those of skill in the art will recognize that, by making minor variations to the method shown, the method of the invention can be used to fabricate a differential pressure sensor package. A method for making an absolute pressure sensor package is discussed in detail above, and shown in FIGS. 3A to 3L and 5A to 5M, for simplicity sake only and to keep the present discussion as brief and simple as possible. However, the scope of the invention is at least as broad as given by the following claims.

What is claimed is:

1. A pressure sensor die package comprising:
   a pressure sensor die, said pressure sensor die comprising a pressure sensor die first surface and a pressure sensor die second surface, opposite said pressure sensor die first surface;
   a substrate, said substrate comprising a substrate first surface and a substrate second surface, opposite said substrate first surface, said substrate first surface comprising a die attach region, said pressure sensor die second surface being attached to said substrate first surface in said die attach region;
   encapsulant, said encapsulant comprising an outer surface, said encapsulant covering a portion of said substrate first surface and said pressure sensor die, said encapsulant comprising a cavity over said pressure sensor die first surface such that a first region of said pressure sensor die first surface is not covered by said encapsulant; and
   coupling gel, said coupling gel filling at least a portion of said cavity in said encapsulant such that said coupling gel covers said first region of said pressure sensor die first surface.

2. The pressure sensor die package of claim 1, wherein said cavity in said encapsulant has a depth perpendicular to said pressure sensor die first surface of approximately at least 0.254 mm.

3. The pressure sensor die package of claim 1, wherein said cavity in said encapsulant has a length and width parallel to said pressure sensor die first surface of approximately 1.0 mm square.

4. The pressure sensor die package of claim 1, wherein said coupling gel fills approximately at least 80% of said cavity in said encapsulant.

5. The pressure sensor die package of claim 1, further comprising:
   bond wires, said bond wires electrically connecting electrical contacts on said pressure sensor die first surface to electrical contacts on said substrate first surface.

6. The pressure sensor die package of claim 5, wherein said pressure sensor die is an absolute pressure sensor die.

7. The pressure sensor die package of claim 6, further comprising:
   a plurality of solder balls, said plurality of solder balls being formed on electrical contacts on said substrate second surface.

8. The pressure sensor die package of claim 6, further comprising:
   a plurality pins, said plurality of pins being formed on electrical contacts on said substrate second surface.

9. The pressure sensor die package of claim 6, further comprising:
   a plurality leadless chip carrier contacts, said plurality of leadless chip carrier contacts being formed on electrical contacts on said substrate second surface.

10. The pressure sensor die package of claim 1, wherein said pressure sensor die package has a thickness measured from said substrate second surface to said encapsulant outer surface of approximately 1.8 mm.

11. The pressure sensor die package of claim 5, further comprising:
    a substrate through hole in said substrate, said substrate through hole extending from said substrate second surface to said substrate first surface in said die attach region.

12. The pressure sensor die package of claim 11, wherein said pressure sensor die is an differential pressure sensor die, said differential pressure sensor die comprising a die hole connecting said second surface of said differential pressure sensor die to a cavity formed in said differential pressure sensor die, said die hole being at least partially aligned with said substrate through hole.

13. The pressure sensor die package of claim 12, further comprising:
    a plurality of solder balls, said plurality of solder balls being formed on electrical contacts on said substrate second surface.

14. The pressure sensor die package of claim 12, further comprising:
    a plurality pins, said plurality of pins being formed on electrical contacts on said substrate second surface.

15. The pressure sensor die package of claim 12, further comprising:
    a plurality leadless chip carrier contacts, said plurality of leadless chip carrier contacts being formed on electrical contacts on said substrate second surface.

16. The pressure sensor die package of claim 12, wherein said pressure sensor die package has a thickness measured from said substrate second surface to said encapsulant outer surface of approximately 1.8 mm.

17. An array of pressure sensor die packages comprising:
    a plurality of pressure sensor dice, said pressure sensor dice each comprising a pressure sensor die first surface and a pressure sensor die second surface, opposite said pressure sensor die first surface;
    an array substrate, said array substrate comprising an array substrate first surface and an array substrate second surface, opposite said array substrate first surface, said array substrate first surface comprising a plurality of die attach regions, said pressure sensor dice second surfaces being attached to said die attach regions such that no more than one pressure sensor die is attached in each die attach region; and
    encapsulant, said encapsulant comprising an outer surface, said encapsulant covering a portion of said array substrate first surface and said pressure sensor dice, said encapsulant comprising a plurality of cavities over said pressure sensor dice first surfaces such that a first region of each of said pressure sensor dice first surfaces is not covered by said encapsulant.

18. The array of pressure sensor die packages of claim 17, further comprising:
    coupling gel, said coupling gel filling at least a portion of each of said plurality of cavities in said encapsulant such that said first regions of said first surfaces of each of said plurality of pressure sensor dice is covered by said coupling gel.

19. The array of pressure sensor die packages of claim 18, further comprising:
    bond wires, said bond wires electrically connecting electrical contacts on each of said plurality of pressure sensor dice first surfaces to electrical contacts on said substrate first surface.

20. The array of pressure sensor die packages of claim 19, wherein each of said plurality of pressure sensor dice is an absolute pressure sensor die.

21. The pressure sensor die package of claim 19, further comprising:
    a plurality of substrate through holes in said array substrate, each of said plurality of substrate through holes extending from said array substrate second surface to said array substrate first surface in each of said plurality of die attach regions.

22. The array of pressure sensor die packages of claim 21, wherein each of said plurality of pressure sensor dice is a differential pressure sensor die, said plurality of differential pressure sensor dice each comprising a die hole connecting said second surface of each of said differential pressure sensor dice to a cavity formed in said differential pressure sensor dice, each of said die holes being at least partially aligned with one of said plurality of substrate through holes.

23. A pressure sensor package comprising:
pressure sensor means, said pressure sensor means comprising a pressure sensor means first surface and a pressure sensor means second surface, opposite said pressure sensor means first surface;
a support means, said support means comprising a support means first surface and a support means second surface, opposite said support means first surface, said support means first surface comprising a pressure sensor means attach region;
means for attaching said pressure sensor means second surface to said support means first surface in said pressure sensor means attach region;
means for forming a cavity over a first region of said pressure sensor means first surface, said cavity comprising side surfaces and a bottom surface wherein;
said first region of said pressure sensor means first surface is said bottom surface of said cavity and said first region of said pressure sensor means first surface is exposed at the bottom of said cavity; and
coupling means for covering said first region of said first surface of said pressure sensor means at the bottom of said cavity, said coupling means filling at least a portion of said cavity.

24. A pressure sensor die package comprising:
a pressure sensor die, said pressure sensor die comprising a pressure sensor die first surface and a pressure sensor die second surface, opposite said pressure sensor die first surface;
a substrate, said substrate comprising a substrate first surface and a substrate second surface, opposite said substrate first surface, said substrate first surface comprising a die attach region, said pressure sensor die second surface being attached to said substrate first surface in said die attach region;
encapsulant, said encapsulant comprising an outer surface, said encapsulant covering a portion of said substrate first surface and said pressure sensor die, said encapsulant comprising a cavity over said pressure sensor die first surface, said cavity in said encapsulant comprising a length and width parallel to said pressure sensor die first surface of approximately 1.0 mm square and a cavity depth perpendicular to said pressure sensor die first surface of approximately at least 0.254 mm, such that a first region of said pressure sensor die first surface is not covered by said encapsulant; and
coupling gel, said coupling gel filling at least a portion of said cavity in said encapsulant such that said coupling gel covers said first region of said pressure sensor die first surface.

25. A pressure sensor die package comprising:
a pressure sensor die, said pressure sensor die comprising a pressure sensor die first surface and a pressure sensor die second surface, opposite said pressure sensor die first surface, said pressure sensor die comprising a differential pressure sensor die with a die hole connecting said second surface of said pressure sensor die to a cavity formed in said pressure sensor die;
a substrate, said substrate comprising a substrate first surface and a substrate second surface, opposite said substrate first surface, said substrate first surface comprising a die attach region, said pressure sensor die second surface being attached to said substrate first surface in said die attach region;
encapsulant, said encapsulant comprising an outer surface, said encapsulant covering a portion of said substrate first surface and said pressure sensor die, said encapsulant comprising a cavity over said pressure sensor die first surface, said cavity in said encapsulant comprising a length and width parallel to said pressure sensor die first surface of approximately 1.0 mm square and a cavity depth perpendicular to said pressure sensor die first surface of approximately at least 0.254 mm, such that a first region of said pressure sensor die first surface is not covered by said encapsulant;
coupling gel, said coupling gel filling at least a portion of said cavity in said encapsulant such that said coupling gel covers said first region of said pressure sensor die first surface; and
a substrate through hole in said substrate, said substrate through hole extending from said substrate second surface to said substrate first surface in said die attach region wherein, said die hole is at least partially aligned with said substrate through hole.

26. An array of pressure sensor die packages comprising:
a plurality of pressure sensor dice, said pressure sensor dice each comprising a pressure sensor die first surface and a pressure sensor die second surface, opposite said pressure sensor die first surface;
an array substrate, said array substrate comprising an array substrate first surface and an array substrate second surface, opposite said array substrate first surface, said array substrate first surface comprising a plurality of die attach regions, said pressure sensor dice second surfaces being attached to said die attach regions such that no more than one pressure sensor die is attached in each die attach region;
encapsulant, said encapsulant comprising an outer surface, said encapsulant covering a portion of said array substrate first surface and said pressure sensor dice, said encapsulant comprising a plurality of cavities over said pressure sensor dice first surfaces such that a first region of each of said pressure sensor dice first surfaces is not covered by said encapsulant; and
coupling gel, said coupling gel filling at least a portion of each of said plurality of cavities in said encapsulant such that said first regions of said first surfaces of each of said plurality of pressure sensor dice is covered by said coupling gel.

27. An array of pressure sensor die packages comprising:
a plurality of pressure sensor dice, said pressure sensor dice each comprising a pressure sensor die first surface and a pressure sensor die second surface, opposite said pressure sensor die first surface, each of said plurality of pressure sensor dice being a differential pressure sensor die, said plurality of pressure sensor dice each comprising a die hole connecting said second surface of each of said pressure sensor dice to a corresponding cavity formed in each of said pressure sensor dice;
an array substrate, said array substrate comprising an array substrate first surface and an array substrate second surface, opposite said array substrate first surface, said array substrate first surface comprising a plurality of die attach regions, said pressure sensor dice second surfaces being attached to said die attach regions such that no more than one pressure sensor die is attached in each die attach region;

encapsulant, said encapsulant comprising an outer surface, said encapsulant covering a portion of said array substrate first surface and said pressure sensor dice, said encapsulant comprising a plurality of cavities over said pressure sensor dice first surfaces such that a first region of each of said pressure sensor dice first surfaces is not covered by said encapsulant;

coupling gel, said coupling gel filling at least a portion of each of said plurality of cavities in said encapsulant such that said first regions of said first surfaces of each of said plurality of pressure sensor dice is covered by said coupling gel; and a plurality of substrate through holes in said array substrate, each of said plurality of substrate through holes extending from said array substrate second surface to said array substrate first surface in each of said plurality of die attach regions wherein, each of said die holes is at least partially aligned with one of said plurality of substrate through holes.

28. A pressure sensor package comprising:

pressure sensor means, said pressure sensor means comprising a pressure sensor means first surface and a pressure sensor means second surface, opposite said pressure sensor means first surface;

a support means, said support means comprising a support means first surface and a support means second surface, opposite said support means first surface, said support means first surface comprising a pressure sensor means attach region;

means for attaching said pressure sensor means second surface to said support means first surface in said pressure sensor means attach region; and means for forming a cavity over a first region of said pressure sensor means first surface, said cavity comprising side surfaces and a bottom surface wherein;

said first region of said pressure sensor means first surface is said bottom surface of said cavity and said first region of said pressure sensor means first surface is exposed at the bottom of said cavity; and coupling means for covering said first region of said first surface of said pressure sensor means at the bottom of said cavity, said coupling means filling at least a portion of said cavity.

* * * * *